(12) United States Patent
Chen et al.

(10) Patent No.: US 7,701,719 B2
(45) Date of Patent: Apr. 20, 2010

(54) FASTENING DEVICE FOR THERMAL MODULE

(75) Inventors: Chin-Hsien Chen, Taipei Hsien (TW); Rung-An Chen, Taipei Hsien (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/256,437

(22) Filed: Oct. 22, 2008

(65) Prior Publication Data

US 2010/0002394 A1    Jan. 7, 2010

(30) Foreign Application Priority Data

Jul. 4, 2008    (CN) .................. 2008 1 0068328

(51) Int. Cl.
    *H05K 7/20*    (2006.01)
(52) U.S. Cl. .................. 361/700; 361/704; 361/719; 257/715; 257/718; 257/719; 257/727; 174/15.2; 174/16.1; 165/80.4; 165/104.33; 24/453; 24/628
(58) Field of Classification Search .................. None
    See application file for complete search history.

(56) References Cited

U.S. PATENT DOCUMENTS

| | | | | |
|---|---|---|---|---|
| 6,865,082 B2 * | 3/2005 | Huang et al. | .................. | 361/700 |
| 6,883,594 B2 * | 4/2005 | Sarraf et al. | ............ | 165/104.33 |
| 6,966,363 B2 * | 11/2005 | Gailus et al. | ................. | 165/185 |
| 7,375,963 B2 * | 5/2008 | Eckberg et al. | .............. | 361/704 |
| 7,397,667 B2 * | 7/2008 | Lin et al. | ..................... | 361/719 |
| 7,426,112 B2 * | 9/2008 | Chi-Wei et al. | .............. | 361/700 |
| 7,489,510 B1 * | 2/2009 | Hung et al. | ................... | 361/700 |
| 2007/0253769 A1 * | 11/2007 | Hwang et al. | ................ | 403/326 |
| 2007/0272395 A1 | 11/2007 | Hwang et al. | | |

* cited by examiner

*Primary Examiner*—Boris L Chervinsky
(74) *Attorney, Agent, or Firm*—Frank R. Niranjan

(57) ABSTRACT

A thermal module includes a heat sink (20), a heat pipe (10) and a fastening device (100). The heat pipe has a condenser section (14) connected with the heat sink. The fastening device includes a base member (50) for fixing an evaporator section of the heat pipe, a positioning pole (58) disposed on and connected to the base member, and an elastic member (30). The positioning pole includes a neck (580) and a head (582). The elastic member includes an abutting portion (32) defining therein a positioning hole (320), and two locking portions (34) extending from the abutting portion. The neck of the positioning pole is freely and loosely received in the positioning hole of the abutting portion. A maximal outer diameter of the head of the positioning pole exceeds a diameter of the fixing hole.

10 Claims, 3 Drawing Sheets

FASTENING DEVICE FOR THERMAL MODULE

BACKGROUND

1. Field of the Invention

The disclosure relates generally to a fastening device, and more particularly to a fastening device for mounting a thermal module onto a heat generating electronic component.

2. Description of Related Art

It is widely acknowledged that heat is produced during operation of electronic components such as central processing units (CPUs) of computers. The heat produced by the CPUs must be quickly removed to protect the CPU. Typically, a thermal module is provided to remove heat from a CPU of a notebook computer. To maintain intimate contact with the CPU, a fastening device is generally required.

A conventional thermal module includes a thermal attachment block, a heat pipe, a fin assembly and a plurality of elastic members. The block has a bottom surface contacting a CPU mounted on a printed circuit board and a top surface defining a groove therein. The heat pipe includes an evaporator section received in the groove of the block, and a condenser section thermally contacted to the fin assembly. The elastic members are disposed at two opposite sides or four corners of the block. The elastic members and the block are firmly combined by soldering or riveting. An assembly hole is defined adjacent to a free end of each elastic member for mounting the thermal module to the printed circuit board. When the thermal module is mounted to the printed circuit board, the block is disposed on a top surface of the CPU. The assembly holes of the elastic members align with corresponding mounting holes of the printed circuit board. Fasteners extend through the assembly holes of the elastic members and engage with mounting holes of the printed circuit board, lowering the block. Thus, the thermal module is mounted to the printed circuit board with the block thermally contacting the electronic component.

However, the elastic members are firmly combined with the block by soldering or riveting, rendering the thermal module applicable for only printed circuit boards with appropriately positioned mounting holes. When positions of the mounting holes are changed due to changed requirements of layout of components on the printed circuit board, a newly designed block can be applied. In addition, soldering or riveting stress can deform junctures of the elastic members and the block, adversely affecting contact between the block and the heat generating electronic component, thereby reducing heat transfer efficiency therebetween.

What is needed, therefore, is an thermal module with improved fastening device which can overcome the limitations described.

SUMMARY

A thermal module includes a heat sink, a heat pipe and a fastening device. The heat pipe has a condenser section connected with the heat sink. The fastening device includes a base member for fixing an evaporator section of the heat pipe, a positioning pole disposed on and connected to the base member, and an elastic member. The positioning pole includes a neck and a head formed at an end of the neck. The elastic member includes an abutting portion and two locking portions extending outwardly from two opposite ends of the abutting portion. The abutting portion of the elastic member defines a positioning hole therein. The neck of the positioning pole is freely and loosely received in the positioning hole of the abutting portion. A maximal outer diameter of the head of the positioning pole exceeds a diameter of the fixing hole, preventing escape of the elastic member therefrom.

Other advantages and novel features will become more apparent from the following detailed description of embodiments when taken in conjunction with the accompanying drawings.

DETAILED DESCRIPTION

Figure 1:
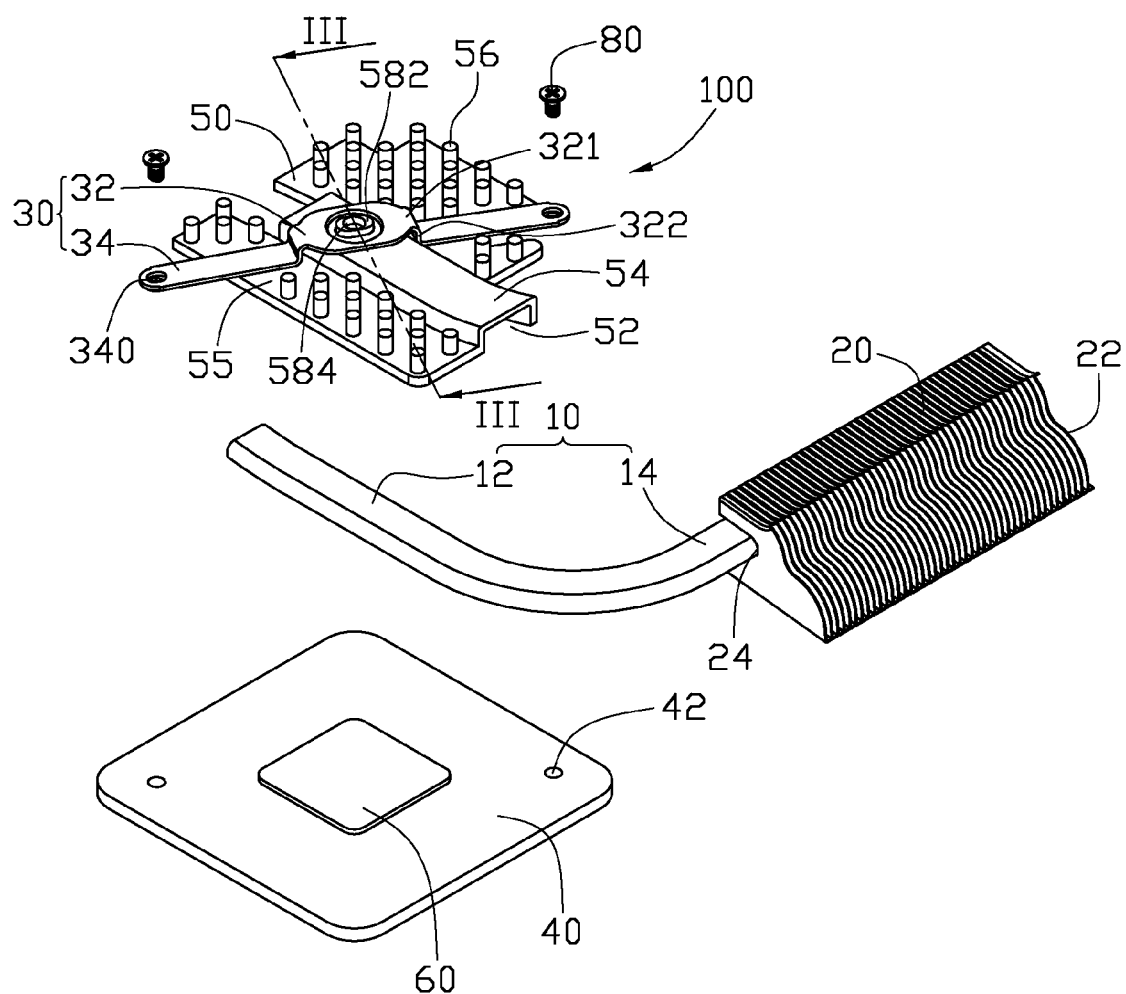
FIG. 1 is an isometric, exploded view of a thermal module according to an exemplary embodiment, with a heat generating electronic component mounted on a printed circuit board.
Figure 2:
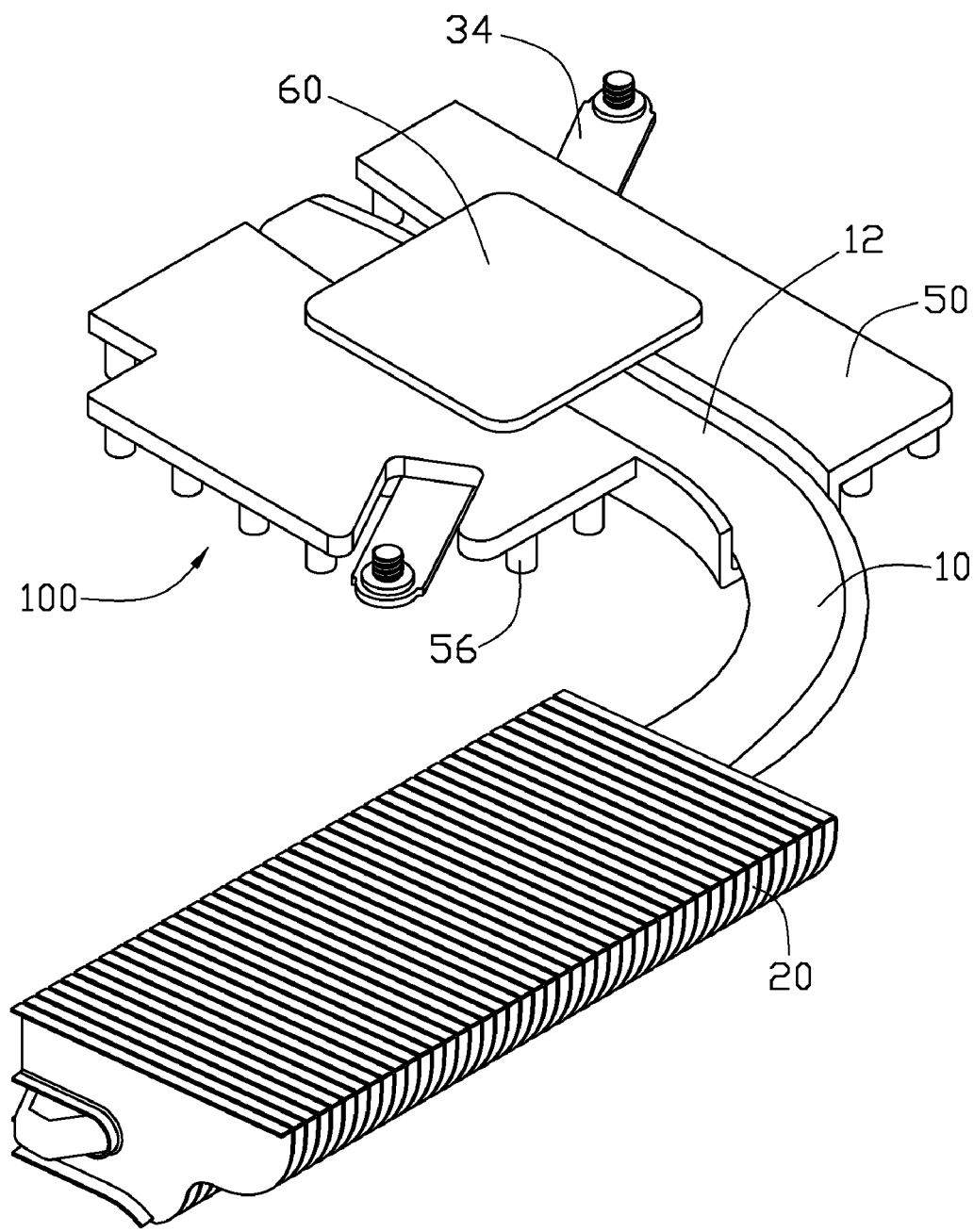
FIG. 2 is an isometric, assembled view of the thermal module assembled to the electronic component of the printed circuit board of FIG. 1, viewed from another aspect.

Referring to FIGS. 1 and 2, a thermal module includes a fastening device 100, a flattened heat pipe 10, and a heat sink 20. The fastening device 100 includes a plate-shaped base member 50 contacting a heat generating electronic component 60 mounted on a printed circuit board 40, and a longitudinal elastic member 30 for mounting the thermal module to the printed circuit board 40.

The heat pipe 10 has an L-shaped configuration and includes an evaporator section 12 fixed to the base member 50 and thermally contacting the electronic component 60, and a condenser section 14 thermally connecting with the heat sink 20 to transfer heat therebetween. The heat sink 20 includes a plurality of stacked parallel fins 22. A groove 24 is defined in the heat sink 20 for receiving the condenser section 14 of the heat pipe 10 therein.

The base member 50 is material having good thermal conductivity such as copper or aluminum. The base member 50 includes a receiving portion 54 receiving the evaporator section 12 of the heat pipe 10 and two flanges 55 extending outwardly from two opposite sides of the receiving portion 54. The receiving portion 54 includes a top wall 541 and two sidewalls 542 extending downwardly from two opposite sides (left and right) of the top wall 541, respectively (see FIG. 3). A receiving channel 52 is formed between the top wall 541 and the sidewalls 542 for receiving the evaporator section 12 of the heat pipe 10 therein. A layer of thermal grease can be applied on an inner surface 543 of the receiving portion 54 for improving heat conductivity between the evaporator section 12 and the receiving portion 54. The flanges 55 extend outwardly and transversely from bottom ends of the two sidewalls 542, respectively. The flanges 55 are approximately perpendicular to the sidewalls 542, and parallel to the top wall 541 of receiving portion 54. When the thermal module is mounted to the printed circuit board 40, bottom surfaces of the flanges 55 and a planar bottom surface of the evaporator section 12 of the heat pipe 10 are coplanar, both thermally contacting an outer surface (i.e., top surface) of the electronic component 60 for absorbing heat generated thereby. A plurality of heat dissipating pins 56 extend upwardly from a top surface of each flange 55 for dissipating heat transferred thereto from the electronic component 60.

Figure 3:
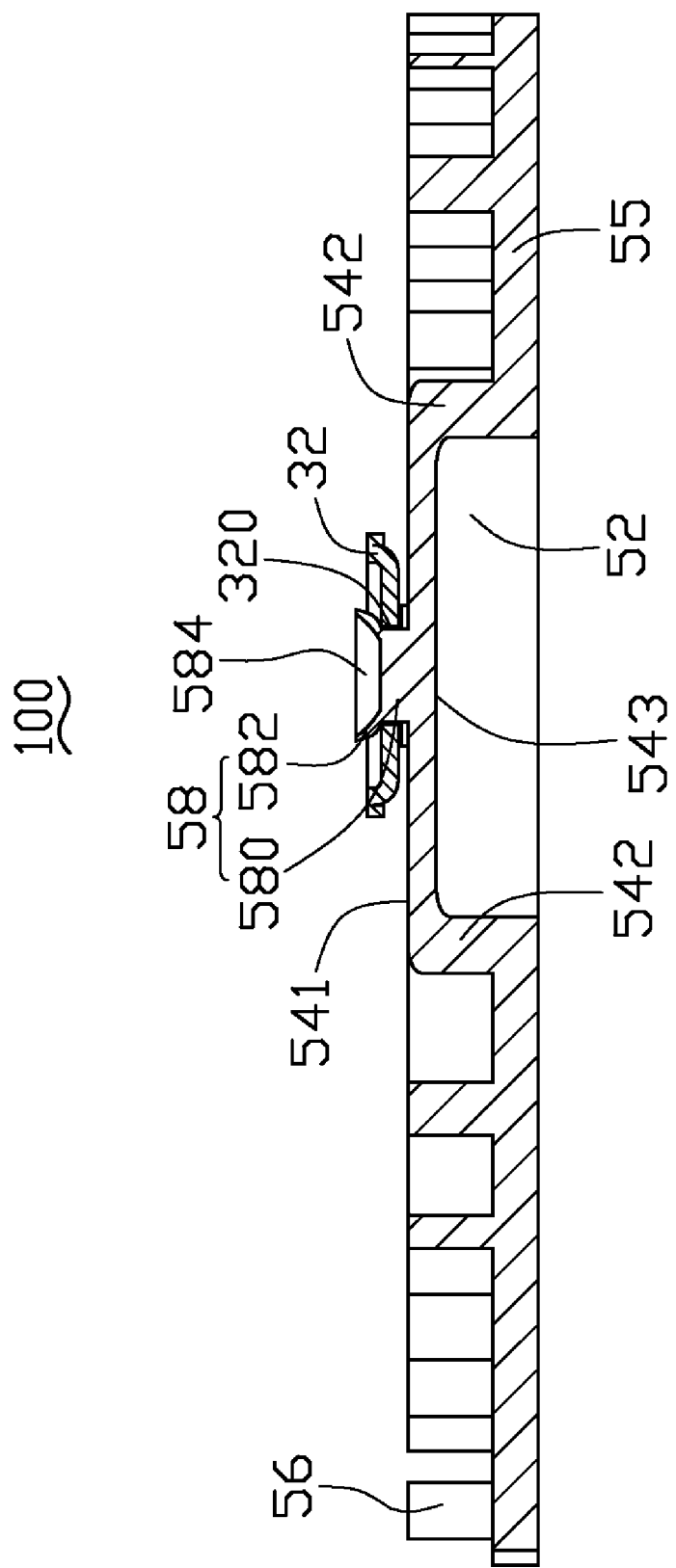
FIG. 3 is a schematic cross-section of a fastening device of the thermal module in FIG. 1, taken from line III-III thereof.

Referring also to FIG. 3, a positioning pole 58 extends upwardly from the top wall 541 of the base member 50 for pivotally connecting the elastic member 30 to the base member 50. The positioning pole 58 includes a neck 580 connecting with the top wall 541 and a head 582 formed at a top end of neck 580. A maximal outer diameter of the head 582 exceeds that of the neck 580. In this embodiment, the neck 580 is formed by extending integrally and upwardly from the top surface of the top wall 541. The head 582 has an elliptical configuration. The head 582 is formed by expanding a bore 584 defined in a top end of the positioning pole 58 outwardly.

The elastic member 30 includes an abutting portion 32 and two locking portions 34 extending outwardly from two opposite ends (i.e., left and right ends) of the abutting portion 32. The abutting portion 32 includes an abutting wall 321 and two connecting walls 322 extending downwardly from two opposite ends of the abutting wall 321, respectively. A positioning hole 320 is defined in a center portion of the abutting wall 321 through which the positioning pole 58 of the base member 50 extends. A diameter of the positioning hole 320 exceeds the maximal outer diameter of the neck 580, thus the neck 580 can be freely and loosely received in the positioning hole 320. The maximal outer diameter of the head 582 exceeds the diameter of the positioning hole 320 to prevent the elastic member 30 from escaping from the positioning pole 58. The two locking portions 34 extend outwardly and transversely from bottom ends of the two connecting walls 322, respectively. An assembly hole 340 is defined adjacent to a free end of each locking portion 34 for mounting the thermal module to the printed circuit board 40. When the thermal module is assembled, the elastic member 30 is placed on the base member 50. The positioning pole 58 of the base member 50 is received in the positioning hole 320 of the abutting portion 32 and the two connecting walls 322 of elastic member 30 are located at two opposite sides of the receiving portion 54. The top end of the positioning pole 58 extends through the positioning hole 320, and then the head 582 is formed by expanding the bore 584 outwardly. Thus the abutting portion 32 of the elastic member 30 located between the receiving portion 54 and the head 582 is freely and loosely connected to the base member 50. The evaporator section 12 is received in the receiving channel 52 of the base member 50.

When the thermal module is mounted to the printed circuit board 40, the evaporator section 12 and the base member 50 are disposed on the top surface of the electronic component 60. The assembly holes 340 of the two locking portions 34 align with corresponding mounting holes 42 of the printed circuit board 40, and fasteners 80 extend through the assembly holes 340 of the elastic member 30 and engage mounting holes 42 of the printed circuit board 40. The elastic member 30 is deformed to drive the abutting portion 32 to urge the two flanges 55 of the base member 50 and the evaporator section 12 of the heat pipe 100 towards the electronic component 60. Thus, the elastic member 30 exerts a downward force on the base member 50 to firmly contact the flanges 55 of the base member 50 and the evaporator section 12 of the heat pipe 10 with the electronic component 60. In operation, heat generated by the electronic component 60 can be transferred from the evaporator section 12 to the condenser section 14 of the heat pipe 10, and then to the heat sink 20. The fins 22 of the heat sink 20 ultimately transfer the heat to the ambient air. Additionally, heat generated by the electronic component 60 can also be transferred to the environment by the base member 50 and heat dissipating pins 56.

In the exemplary embodiment, the elastic member 30 is capable of rotating relative to the positioning pole 58 to change positions of the locking portions 34. Thus, the fastening device 100 of the thermal module is applicable with more than one kind of printed circuit board. In addition, since the elastic member 30 and the base member 50 are not firmly combined, no soldering or riveting stress is generated between the elastic member and the base member. When the thermal module is mounted to the printed circuit board 60, the base member 50 and evaporator section 12 of the heat pipe 10 contact the electronic component 60 more intimately.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A thermal module comprising:
    a heat sink
    a heat pipe comprising an evaporator section adapted for thermally connecting with a heat generating component mounted on a circuit board, and a condenser section connected with the heat sink; and
    a fastening device for mounting the evaporator section of the heat pipe to the heat generating component, comprising:
    a base member configured for abutting the evaporator section of the heat pipe;
    a positioning pole disposed on and connecting with the base member, the positioning pole comprising a neck and a head formed at a free end thereof; and
    an elastic member comprising an abutting portion and two locking portions extending outwardly from two opposite ends of the abutting portion, the abutting portion of the elastic member defining a positioning hole therein, the neck of the positioning pole being freely and loosely received in the positioning hole of the abutting portion of the elastic member, and a maximal outer diameter of the head of the positioning pole exceeding a diameter of the fixing hole for preventing the elastic member from escaping from the positioning pole.

2. The thermal module of claim 1, wherein the positioning pole extends integrally upwardly from a top surface of the base member.

3. The thermal module of claim 2, wherein the positioning pole defines a bore in a free end thereof, the head being formed by expanding the bore outwardly.

4. The thermal module of claim 1, wherein the base member defines a receiving channel in a bottom surface thereof, the evaporator section of the heat pipe being receiving in the receiving channel of the base member.

5. The thermal module of claim 4, wherein the base member comprises a receiving portion and two flanges extending outwardly from two opposite sides of the receiving portion, the receiving portion comprising a top wall and two sidewalls extending downwardly from two opposite sides of the top wall, the receiving channel being formed between the top wall and the sidewalls.

6. The thermal module of claim 5, wherein the positioning pole extends integrally upwardly from the top wall of the receiving portion.

7. The thermal module of claim 5, wherein the abutting portion comprises an abutting wall and two connecting walls extending downwardly from two opposite ends of the abutting wall, the positioning hole being defined in the abutting wall, the two connecting walls being located at two opposite sides of the receiving portion of the base member.

8. The thermal module of claim 5, wherein the evaporator section of the heat pipe has a planar bottom surface configured for thermally contacting the heat generating component, bottom surfaces of the flanges being coplanar with the bottom surface of the evaporator section of the heat pipe for contacting the heat generating component.

9. The thermal module of claim 8, wherein a plurality of heat dissipating pins extend upwardly from a top surface of each flange for dissipating heat transferred to the each flange from the electronic component.

10. The thermal module of claim 1, wherein the heat sink comprises a plurality of stacked fins.

* * * * *